United States Patent
Kang

(10) Patent No.: US 7,075,810 B2
(45) Date of Patent: Jul. 11, 2006

(54) NONVOLATILE FERROELECTRIC MEMORY DEVICE

(75) Inventor: Hee Bok Kang, Daejeon (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 2 days.

(21) Appl. No.: 10/740,590

(22) Filed: Dec. 22, 2003

(65) Prior Publication Data

US 2005/0105321 A1    May 19, 2005

(30) Foreign Application Priority Data

Nov. 3, 2003    (KR) .................. 10-2003-0077404

(51) Int. Cl.
*G11C 11/22*    (2006.01)
(52) U.S. Cl. ...................... 365/145; 365/149
(58) Field of Classification Search ............... 365/145, 365/149
See application file for complete search history.

(56) References Cited

U.S. PATENT DOCUMENTS

| | | | |
|---|---|---|---|
| 6,272,594 B1 | 8/2001 | Gupta et al. | |
| 6,356,476 B1 * | 3/2002 | Kang | 365/145 |
| 6,363,439 B1 | 3/2002 | Battles et al. | |
| 6,366,489 B1 * | 4/2002 | Salling | 365/145 |
| 6,418,043 B1 * | 7/2002 | Kang | 365/145 |
| 6,717,840 B1 * | 4/2004 | Kang | 365/149 |
| 6,829,155 B1 * | 12/2004 | Kang | 365/145 |
| 6,865,120 B1 * | 3/2005 | Kang | 365/189.12 |
| 6,891,742 B1 * | 5/2005 | Takano et al. | 365/145 |

* cited by examiner

*Primary Examiner*—M. Tran
(74) *Attorney, Agent, or Firm*—Heller Ehrman LLP

(57) ABSTRACT

A nonvolatile ferroelectric memory device transmits/receives data of a cell by using a main bitline of a cell array block as a data bus in a system on chip (SOC) having a hierarchical bitline structure, thereby reducing the chip size. In the nonvolatile ferroelectric memory device, when an interface is performed between a logic processor and a cell array block, cell data and amplification data of a sense amplifier are transmitted into an I/O port interface unit by using a main bitline of the cell array block as a data bus, thereby improving the data access speed and reducing the whole chip size.

18 Claims, 9 Drawing Sheets

US 7,075,810 B2

NONVOLATILE FERROELECTRIC MEMORY DEVICE

BACKGROUND OF THE INVENTION

1. Field of the Invention

The present invention generally relates to a nonvolatile ferroelectric memory device, and more specifically, to a nonvolatile ferroelectric memory device which is configured to use a main bitline of a cell array block as a data bus.

2. Description of the Prior Art

Generally, a ferroelectric random access memory (hereinafter, referred to as 'FeRAM') has attracted considerable attention as next generation memory device because it has a data processing speed as fast as a Dynamic Random Access Memory DRAM and conserves data even after the power is turned off.

The FeRAM having structures similar to the DRAM includes the capacitors made of a ferroelectric substance, so that it utilizes the characteristic of a high residual polarization of the ferroelectric substance in which data is not deleted even after an electric field is eliminated.

The technical contents on the above FeRAM are disclosed in the Korean Patent Application No. 2002-85533 by the same inventor of the present invention. Therefore, the basic structure and the operation on the FeRAM are not described herein.

When the FeRAM having a hierarchical bitline structure in a System On Chip (SOC) exchanges data with a system processor (logic processor), a wide port is required to process large data simultaneously. For example, a LCD (Liquid Crystal Display) driving processor which exchanges large data of numerous kilo bytes (K bytes) for image processing requires a lot of input/output ports.

However, if the number of I/O ports for processing data increases, the data access speed is degraded and the whole chip size increases.

SUMMARY OF THE INVENTION

Accordingly, it is an object of the present invention to improve the data access speed and reduce the whole chip size by exchanging data of a cell and amplification data of a sense amplifier by using a main bitline as a data bus when an interface is performed between a logic processor and a cell array block, thereby.

In an embodiment, a nonvolatile ferroelectric memory device comprises a cell array block and a logic processor. The cell array block stores data with a nonvolatile ferroelectric capacitor as a data storage medium. The logic processor performs a logic operation on sensing data read from the cell array block, and transmits input data into the cell array block. Here, the cell array block exchanges data with the logic processor by using a main bitline of the cell array block.

In another embodiment, a nonvolatile ferroelectric memory device comprises a plurality of cell array blocks and a logic processor. Each of the plurality of cell array blocks comprises a nonvolatile ferroelectric capacitor for storing data. The logic processor performs a logic operation on sensing data outputted from the plurality of cell array blocks, and outputs input data stored in the plurality of cell array blocks into the plurality of cell array blocks. Here, the plurality of cell array blocks exchange data with the logic processor using a main bitline bus in the plurality of cell array blocks.

In still another embodiment, a nonvolatile ferroelectric memory device comprises a cell array block, a logic processor, an input/output port interface unit and a sense amplifier array unit. The cell array block comprises a nonvolatile ferroelectric capacitor for storing data. The logic processor performs a logic operation on sensing data read from the cell array block, and transmits input data into the cell array block. The input/output port interface unit controls interface of the sensing data and the input data between the logic processor and the cell array block. The sense amplifier array unit amplifies the sensing data and outputting the amplified data into the input/output port interface unit. Here, the cell array block exchanges data with the input/output port interface unit and the sense amplifier array unit using a main bitline bus of the cell array block.

DETAILED DESCRIPTION OF THE PREFERRED EMBODIMENTS

The present invention will be described in detail with reference to the accompanying drawings.

Figure 1:
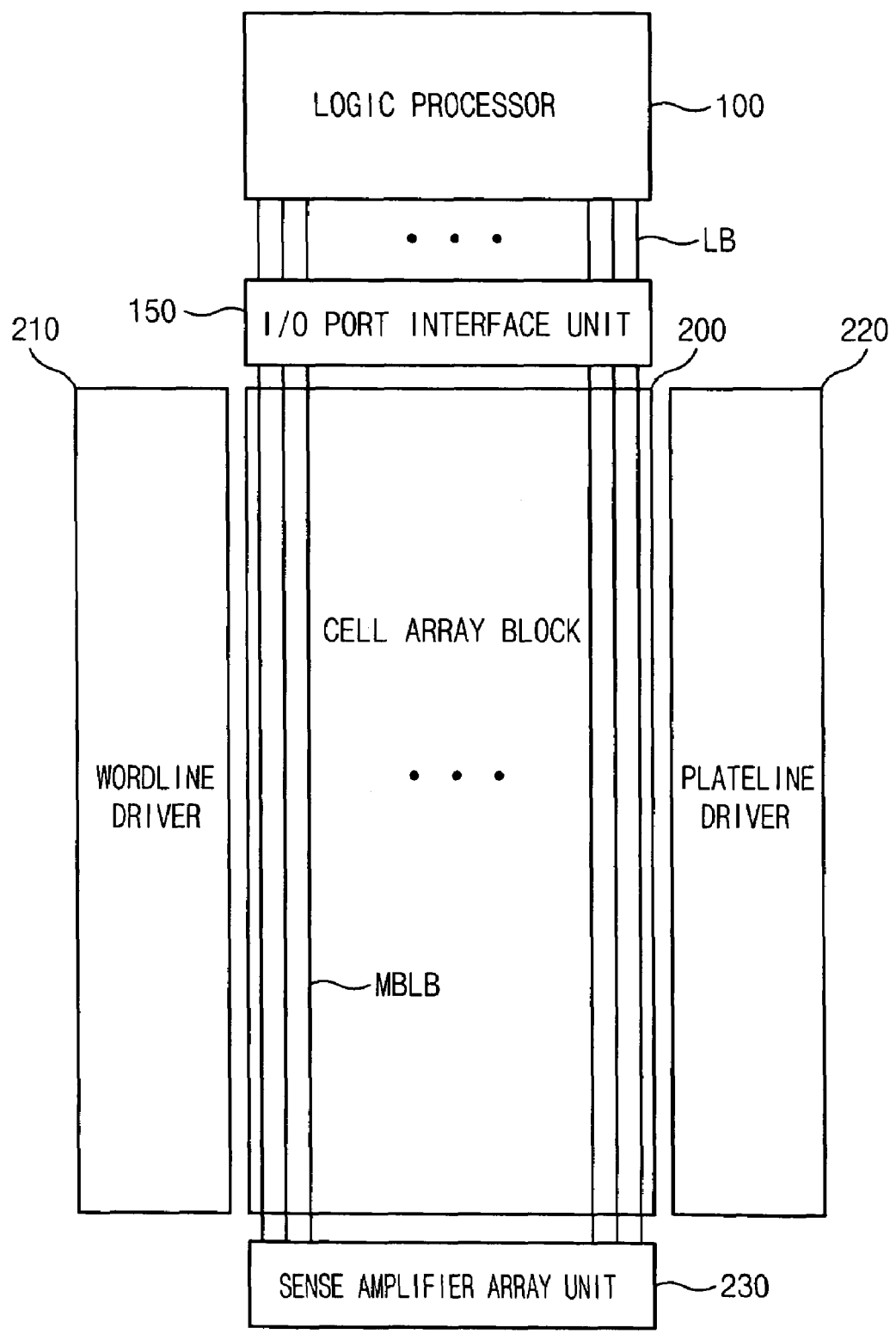
FIGS. 1 and 2 are diagrams illustrating examples of a nonvolatile ferroelectric memory device according to an embodiment of the present invention.

FIG. 1 is a diagram of a nonvolatile ferroelectric memory device according to an embodiment of the present invention.

In an embodiment, the nonvolatile ferroelectric memory device comprises a logic processor 100, an I/O port interface unit 150, a cell array block 200, a wordline driver 210, a plateline driver 220 and a sense amplifier array unit 230.

The logic processor 100 performs a logic operation on data applied from the I/O port interface unit 150 through a logic bus LB. The I/O port interface unit 150 outputs data applied through a main bitline bus MBLB into the logic bus LB, and outputs data applied through the logic bus LB into the main bitline bus MBLB.

Here, the logic processor 100 exchanges data with the I/O port interface unit 150 through the logic bus LB. The I/O port interface unit 150 exchanges data with the sense amplifier array unit 230 through the main bitline bus MBLB.

The main bitline MBL of the cell array block 200 is connected to a sub bitline SBL by a sub bitline switching device, and a plurality of cells are connected to one sub bitline SBL.

The wordline driver 210 controls driving of a corresponding wordline of the cell array block 200. The plateline driver 220 controls driving of a corresponding plateline of the cell array block 200.

In the embodiment, cell data stored in the cell array block are transmitted into the sense amplifier array unit 230 through the main bitline MBL without additional data buses. Data amplified by the sense amplifier array unit 230 are transmitted into the I/O port interface unit 150 through the main bitline MBL.

As a result, since the I/O port interface unit 150, the sense amplifier array unit 230 and the cell array block 200 share the main bitline MBL, a high capacity I/O port can be embodied, thereby reducing the chip size.

Figure 2:
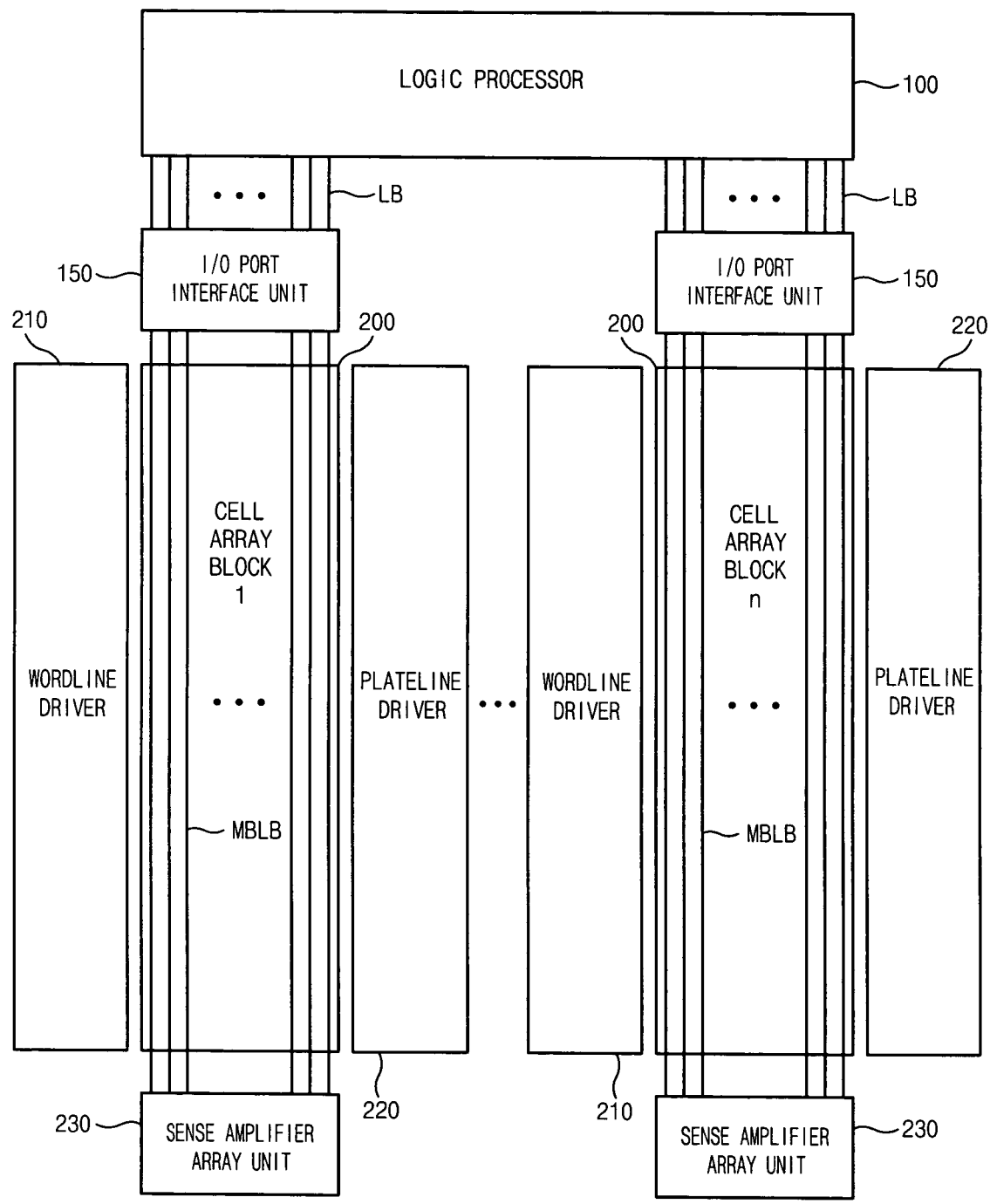

FIG. 2 shows another example of the nonvolatile ferroelectric memory device according to an embodiment of the present invention.

In another embodiment, the nonvolatile ferroelectric memory device comprises a logic processor 100, a plurality of I/O port interface units 150, a plurality of cell array blocks 200, a plurality of wordline drivers 210, a plurality of plateline drivers 220 and a plurality of sense amplifier array units 230.

The embodiment of FIG. 2 is different from that of FIG. 1 in that one logic processor 100 is connected to a plurality of cell array blocks 200.

Since the nonvolatile ferroelectric memory device of FIG. 2 comprises the plurality of cell array blocks 200, data can be processed at a high speed. Here, in the plurality of cell array blocks 20, a part or the whole of cell array blocks 200 can be activated in one operation cycle.

The operation process of FIG. 2 is the same as that of FIG. 1.

Figure 3:
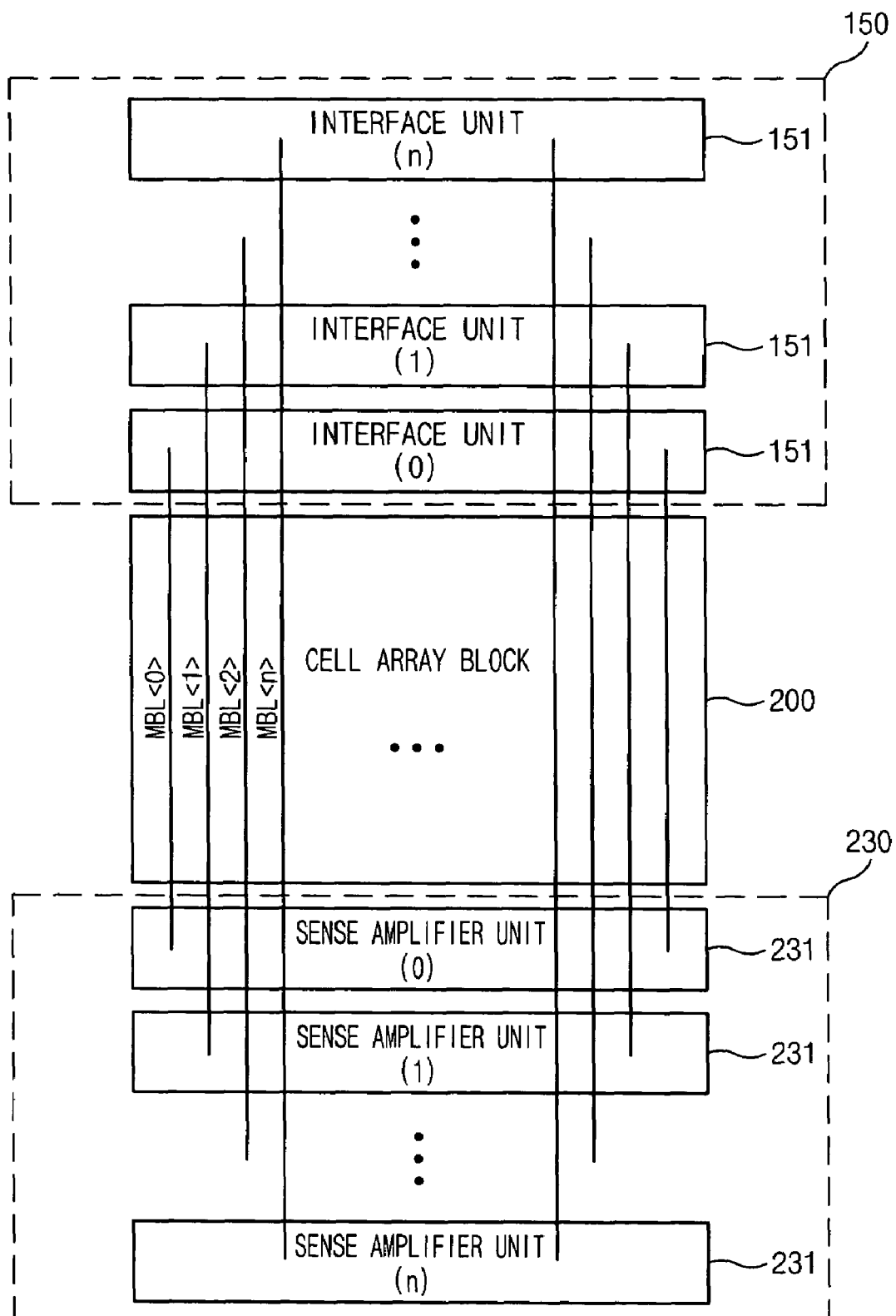
FIG. 3 is a block diagram illustrating a nonvolatile ferroelectric memory device according to an embodiment of the present invention.

FIG. 3 is a diagram illustrating a nonvolatile ferroelectric memory device according to an embodiment of the present invention.

The sense amplifier array unit of FIGS. 1 and 2 comprises a plurality of sense amplifier units 231 connected in parallel. A plurality of main bitlines MBL in the cell array block 200 are sequentially connected to the plurality of sense amplifier units 231, respectively.

The sense amplifier (0) is connected to the main bitlines MBL<0>, MBL<n+1> and MBL<2n+1>. The sense amplifier (1) is connected to the main bitlines MBL<1>, MBL<n+2> and MBL<2n+2>. The sense amplifier (n) is connected to the main bitlines MBL<n>, MBL<2n> and MBL<3n>.

Here, the plurality of sense amplifier units 231 are connected in parallel because the space between the main bitlines MBL is narrow so that each sense amplifier may be arranged in one of the sense amplifier units 231. As a result, the number of the plurality of sense amplifier units 231 is determined by the configuration of the sense amplifier circuit and the cell size.

The I/O port interface unit 150 comprises a plurality of interface units 151 connected in parallel. A plurality of main bitlines MBL in the cell array block 200 are sequentially connected to the plurality of interface units 151.

The interface unit (0) is connected to the main bitlines MBL<0>, MBL<n+1> and MBL<2n+1>. The interface unit (1) is connected to the main bitlines MBL<1>, MBL<n+2> and MBL<2n+2>. The interface unit (n) is connected to the main bitlines MBL<n>, MBL<2n> and MBL<3n>.

Here, the plurality of interface units 151 are connected in parallel because the space between the main bitlines MBL is narrow so that each interface may be arranged in one of the interface units 151. As a result, the number of the interface units 151 is determined by the configuration of the sense amplifier circuit and the cell size.

Figure 4:
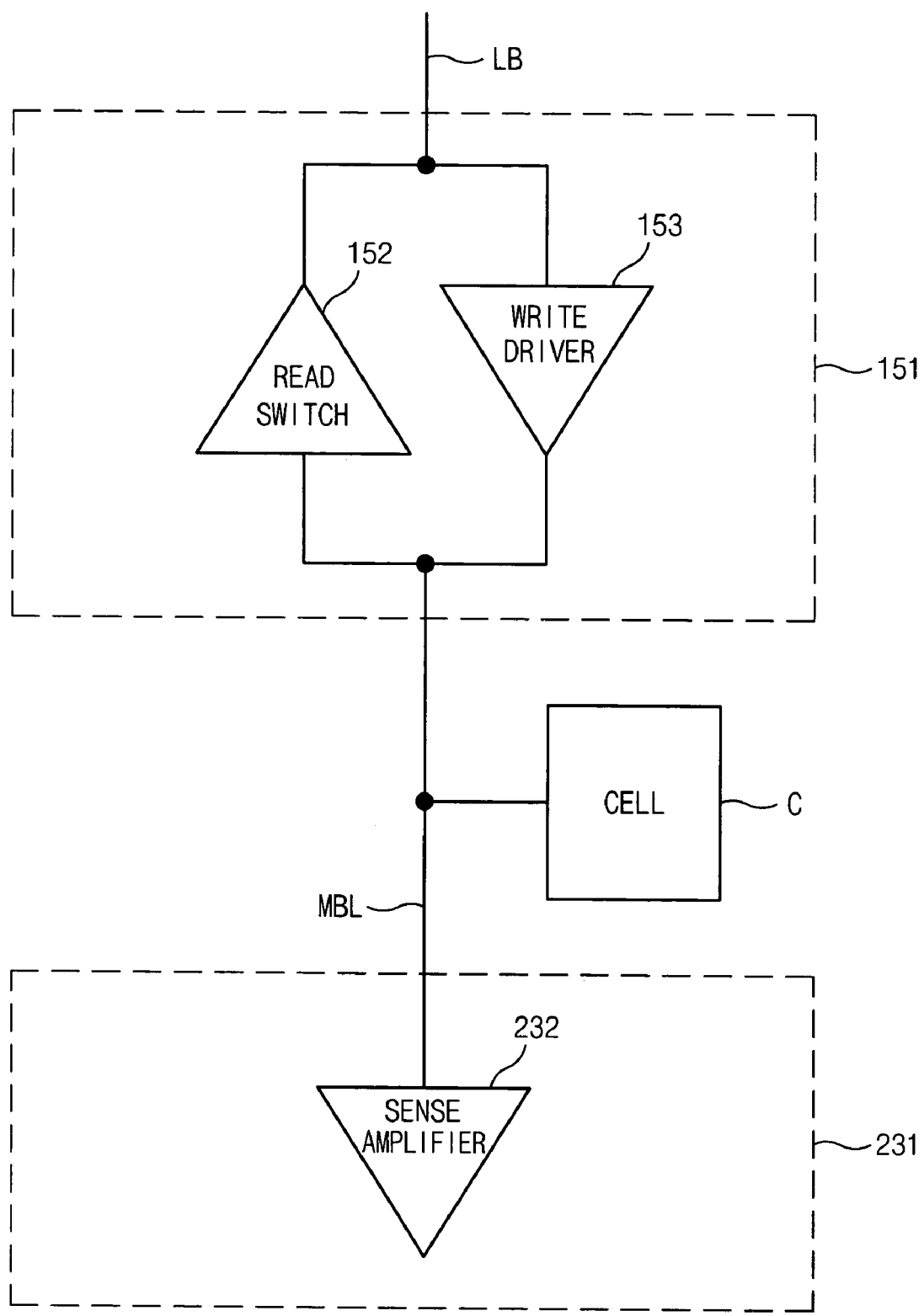
FIG. 4 is a block diagram illustrating an interface unit and a sense amplifier unit of FIG. 3.

FIG. 4 is a block diagram illustrating the interface unit 151 and the sense amplifier unit 231 of FIG. 3.

The interface unit 151 comprises a read switch 152 and a write driver 153.

In a read mode, cell data stored in the cell C are outputted into the sense amplifier 232 through the unit main bitline MBL. The sense amplifier 232 amplifies cell data applied through the main bitline MBL. The data amplified by the sense amplifier 232 are outputted into the read switch 152 of the interface unit 151 through the main bitline MBL.

The read switch 152, which is activated in the read mode, outputs data applied through the main bitline MBL into the logic bus LB. The write driver 153, which is activated in a write mode, outputs data applied from the logic bus LB into the cell C through the main bitline MBL.

Figure 5:
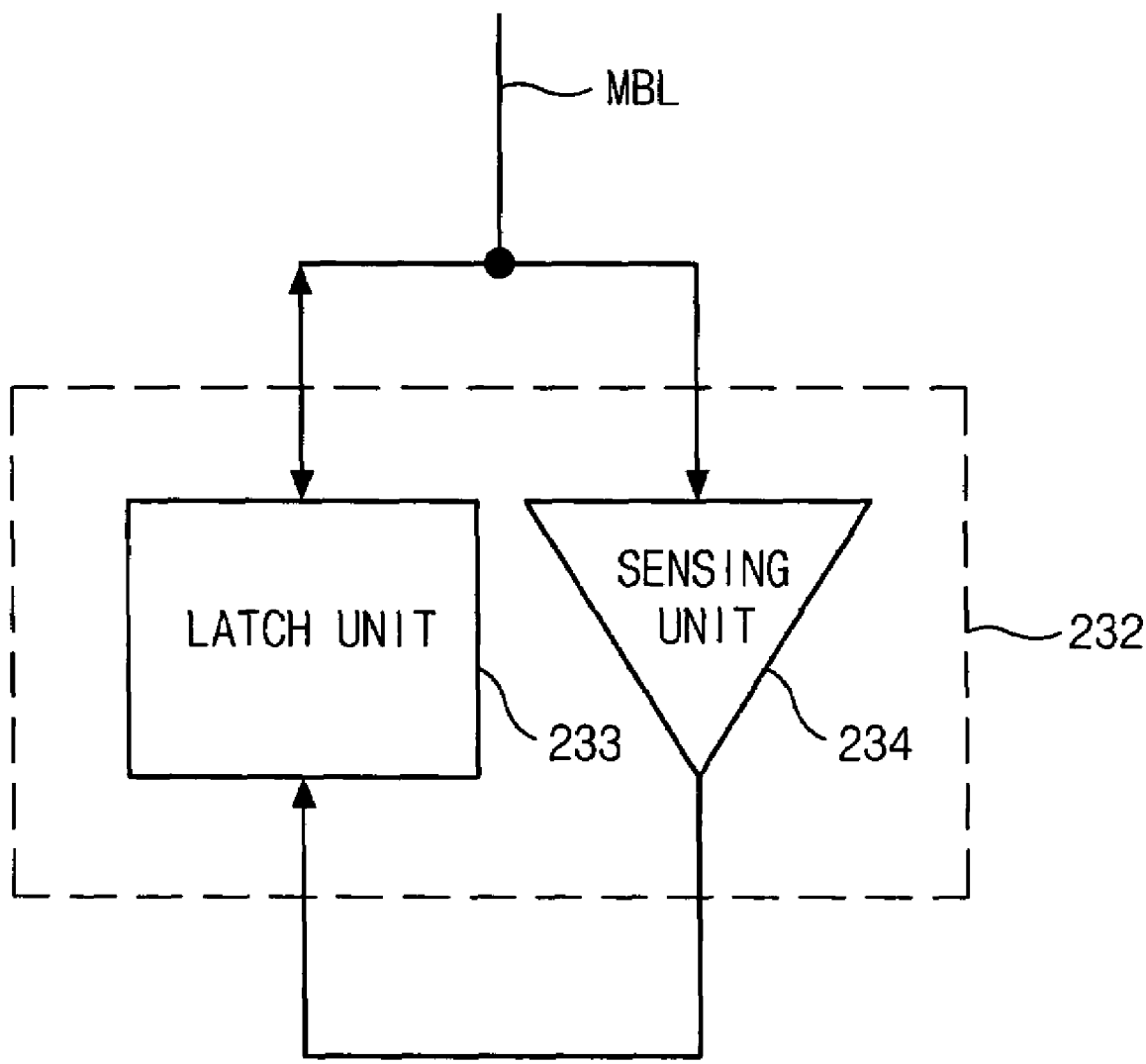
FIG. 5 is a block diagram of a sense amplifier of FIG. 4.

FIG. 5 is a block diagram of the sense amplifier 232 of FIG. 4.

The sense amplifier 232 comprises a latch unit 233 and a sensing unit 234.

In the read mode, the sensing unit 232 senses and amplifies data applied through the main bitline MBL. The latch unit 233 stores data amplified by the sensing unit 234. In a restore mode, data stored in the latch unit 233 are fed back into the main bitline MBL.

In the write mode, data applied from the logic processor 100 through the logic bus LB, the interface unit 151 and the main bitline MBL are stored in the latch unit 232. While data stored in the latch unit 233 are written into the cell C, the write driver 153 is kept inactive to prevent new data from being inputted.

Figure 6:
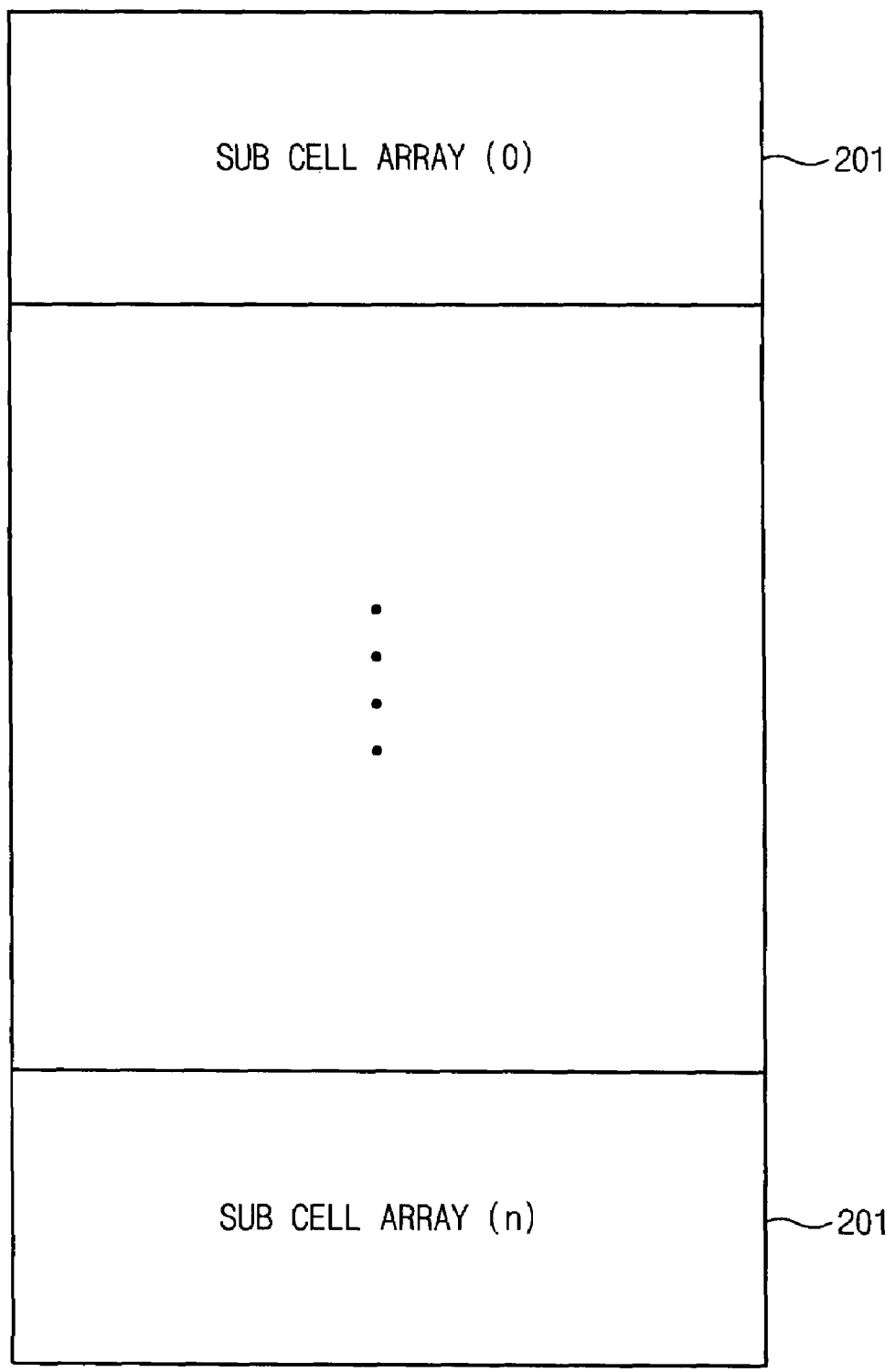
FIG. 6 is a block diagram of a cell array block of FIG. 3.

FIG. 6 is a block diagram of the cell array block 200 of FIG. 3. The cell array block 200 comprises a plurality of sub cell arrays 201 as shown in FIG. 6.

Figure 7:
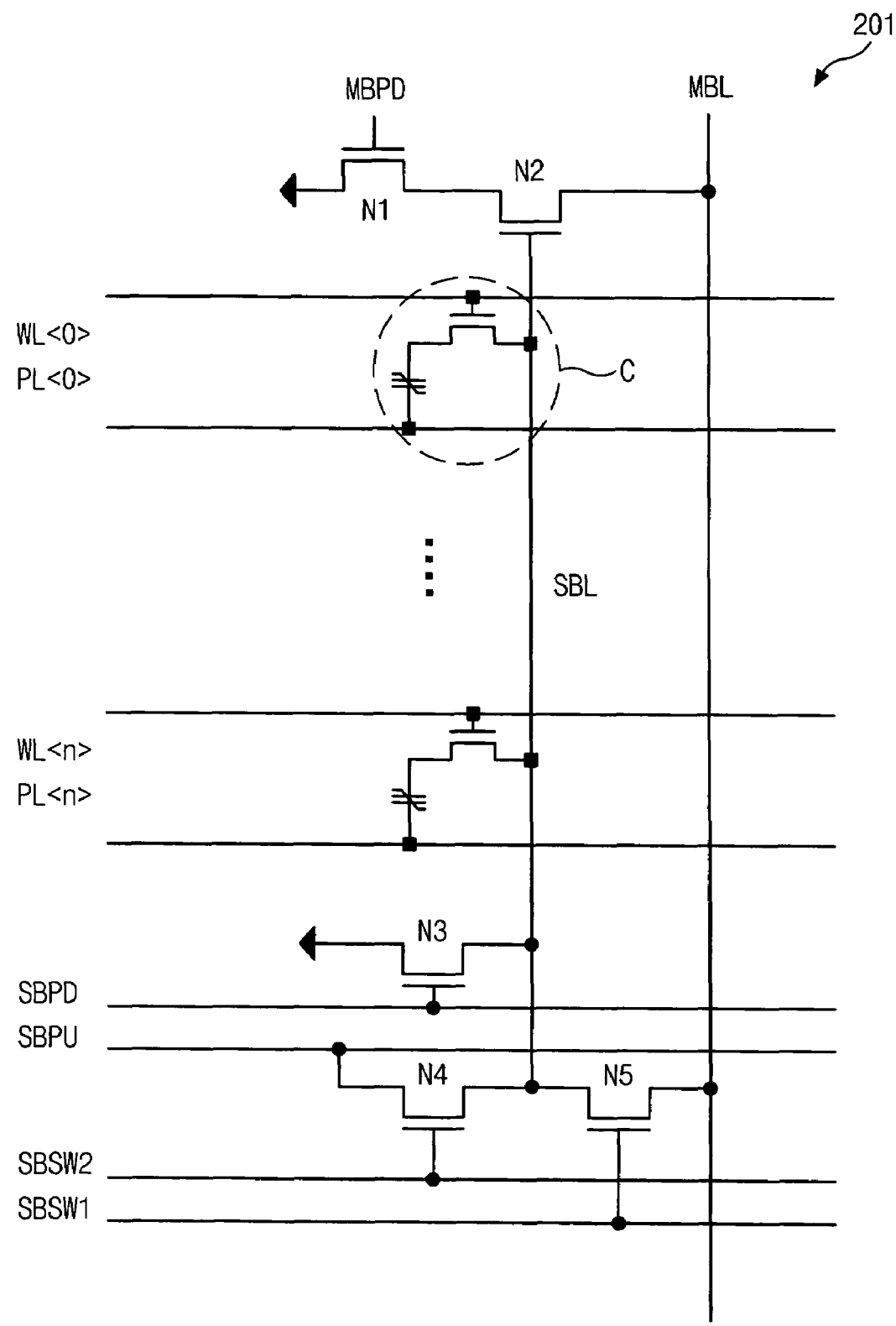
FIG. 7 is a circuit diagram of a sub cell array of FIG. 6.

FIG. 7 is a circuit diagram of the sub cell array 201 of FIG. 6.

The sub cell array 201 has a hierarchical bitline structure comprising main bitlines MBL and sub bitline SBL. Each main bitline MBL of the sub cell array 201 is connected to one of the plurality of sub bitlines SBL. In other words, when one of a plurality of sub bitline selecting signals SBSW1 is activated, an NMOS transistor N5 is turned on to activate one sub bitline SBL. One sub bitline SBL is connected to the plurality of cells C.

When a sub bitline pull-down signal SBPD is activated to turn on an NMOS transistor N3, the sub bitline SBL is pulled down to a ground level.

When a sub bitline selecting signal SBSW2 is activated to turn on an NMOS transistor N4, a sub bitline pull-up signal SBPU is applied into the sub bitline SBL. Here, the sub bitline pull-up signal SBPU has a voltage higher than a power voltage VCC.

The NMOS transistor N1, connected between a ground voltage terminal and the NMOS transistor N2, has a gate to receive a main bitline pull-down signal MBPD. An NMOS transistor N2, connected between an NMOS transistor N1 and the main bitline MBL, has a gate connected to the sub bitline SBL, thereby regulating a sensing voltage of the main bitline MBL.

Figure 8:
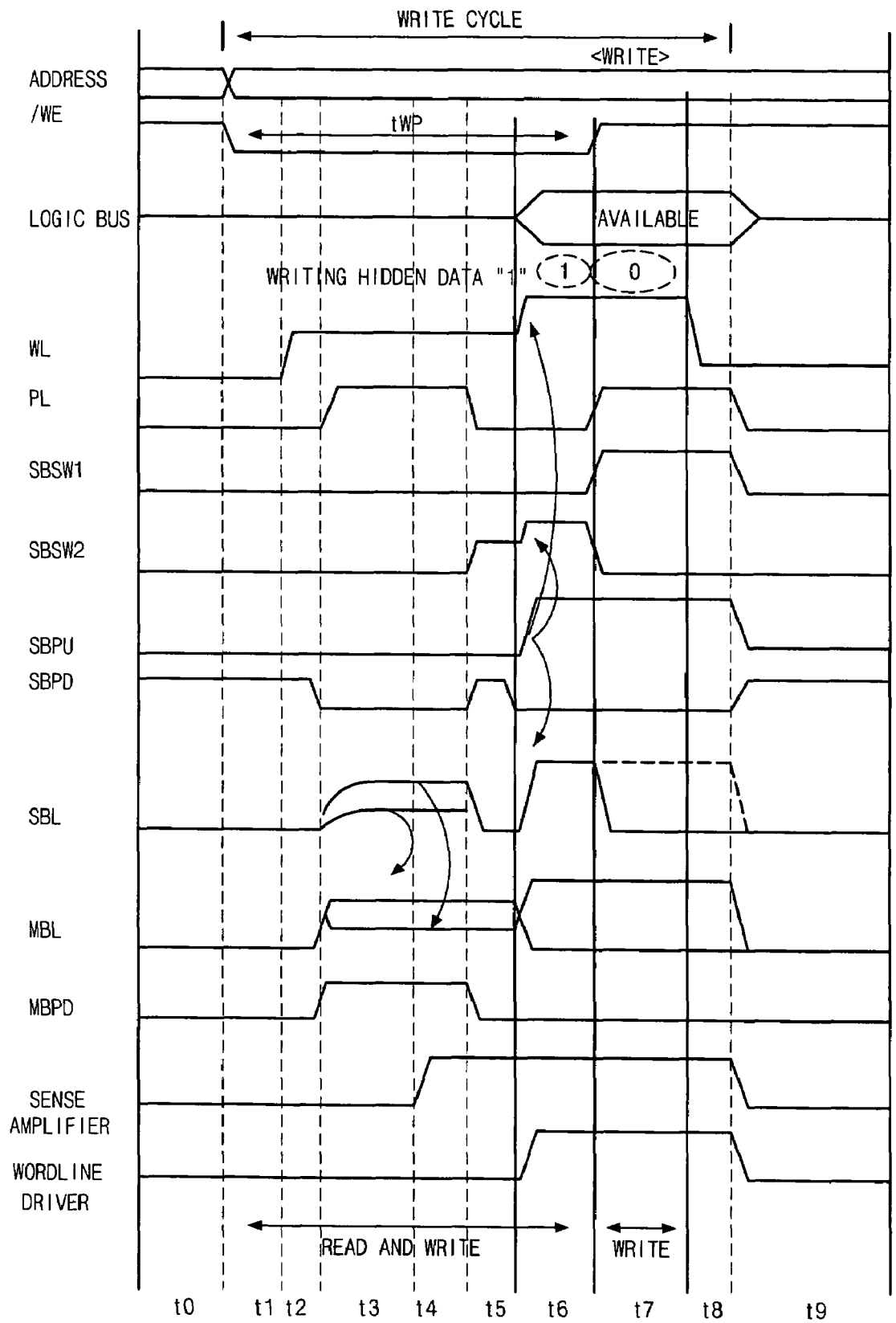
FIG. 8 is a timing diagram illustrating the write mode of the nonvolatile ferroelectric memory device according to an embodiment of the present invention.

FIG. 8 is a timing diagram illustrating the write mode of the nonvolatile ferroelectric memory device according to an embodiment of the present invention.

In an interval t1, an address is inputted. When a write enable signal /WE becomes at a low level, the write mode starts.

In an interval t2, a wordline WL is enabled. In an interval t3, a plateline PL and the main bitline pull-down signal MBPD is enabled to a high level. If the sub bitline pull-down signal SBPD is disabled to a low level, voltage levels of the sub bitline SBL and the main bitline MBL rise.

In an interval t4, the sense amplifier 232 is activated, and cell data are applied to the main bitline MBL. In an interval t5, the plateline PL is disabled to a low level, and the sub bitline selecting signal SBSW2 is enabled to a high level. Then, the sub bitline pull-down signal SBPD is enabled to a high level, and the sub bitline SBL becomes at a low level. Here, the main bitline pull-down signal MBPD is disabled to a low level.

In an interval t6, available data are applied from the logic bus LB, and hidden data "1" is written. The voltage of the wordline WL rises, and the sub bitline selecting signal SBSW2 is enabled to a pumping voltage VPP level in response to the sub bitline pull-up signal SBPU. As a result, the voltage level of the sub bitline SBL rises to the pumping voltage VPP level. Here, the write driver 153 is kept active.

In an interval t7, data are written in the cell C in response to the write enable signal /WE. Here, the plateline PL is enabled to the high level again. The sub bitline selecting signal SBSW1 is enabled to a high level, and the sub bitline selecting signal SBSW2 is disabled to a low level.

In an interval t8, the wordline WL is disabled to a low level. Thereafter, the plateline PL, the sub bitline selecting signal SBSW1 and the sub bitline pull-up signal SBPU are disabled to a low level. Then, the sub bitline pull-down signal SBPD is enabled to a high level. Also, the sense amplifier 232 and the write driver 153 are disabled.

Figure 9:
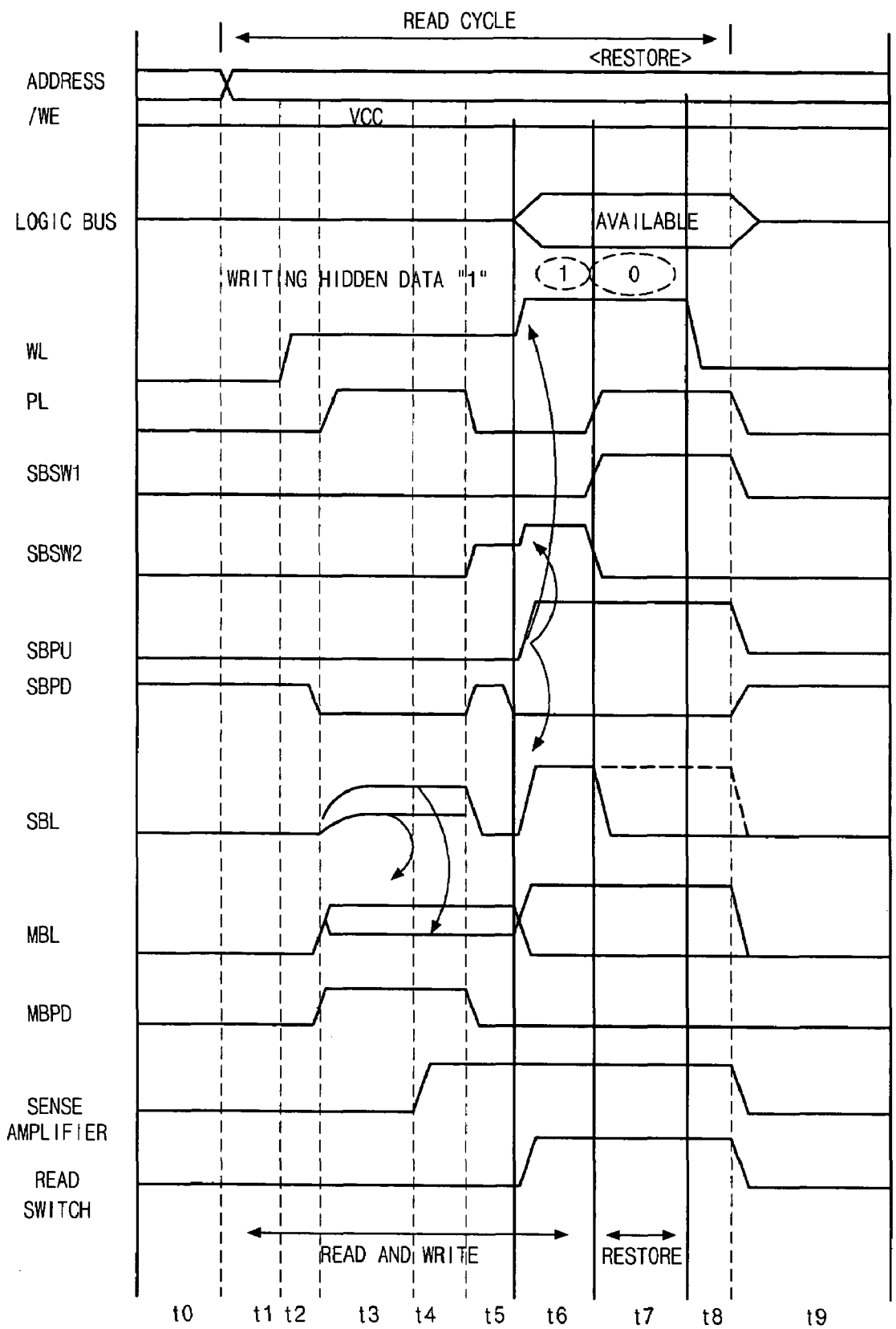
FIG. 9 is a timing diagram illustrating the read mode of the nonvolatile ferroelectric memory device according to an embodiment of the present invention.

FIG. 9 is a timing diagram illustrating the read mode of the nonvolatile ferroelectric memory device according to an embodiment of the present invention.

In the read mode, the write enable signal /WE is maintained at the power voltage VCC level. In the intervals t3 and t4, data are sensed. In the interval t6, hidden data "1" is written. During the interval t6~t8, a data output available interval is maintained. Thereafter, data are restored in the cell.

As discussed earlier, in a nonvolatile ferroelectric memory device, cell data are exchanged with amplification data of a sense amplifier using a main bitline as a data bus when an interface is performed between a logic processor and a cell array block, thereby improving the data access speed and reducing the whole chip size.

What is claimed is:

1. A nonvolatile ferroelectric memory device comprising:
   a cell array block for storing data with a nonvolatile ferroelectric capacitor as a data storage medium;
   a logic processor for performing a logic operation on sensing data read from the cell array block, and for transmitting input data into the cell array block;
   an input/output port interface unit for controlling interface of the sensing data and the input data between the logic processor and the cell array block; and
   a sense amplifier array unit for amplifying the sensing data and outputting the amplified data into the main bitline;
   wherein the cell array block exchanges data with the logic processor by using a main bitline of the cell array block.

2. The device according to claim 1, further comprising a logic bus for exchanging data between the logic processor and the input/output port interface unit.

3. The device according to claim 1, wherein the sense amplifier array unit comprises a plurality of sense amplifiers connected in parallel sequentially corresponding to a plurality of main bitlines.

4. The device according to claim 3, wherein each of the plurality of sense amplifiers comprises:
   a sensing unit for sensing and amplifying data applied through a main bitline; and
   a latch unit for storing data applied through the sensing unit and the main bitline.

5. The device according to claim 1, wherein the input/output port interface unit comprises a plurality of interface units connected in parallel sequentially corresponding to a plurality of main bitlines.

6. The device according to claim 5, wherein each of the plurality of interface units comprises:
   a write driver, activated in a write mode, for transmitting the input data applied from the logic processor into a main bitline; and
   a read switch, activated in a read mode, for transmitting the sensing data applied through the main bitline into the logic processor.

7. The device according to claim 1, further comprising:
   a wordline driver for driving a corresponding wordline of the cell array block; and
   a plateline driver for driving a corresponding plateline of the cell array block.

8. The device according to claim 1, wherein the cell array block comprises a plurality of sub cell array blocks.

9. A nonvolatile ferroelectric memory device comprising:
   a plurality of cell array blocks each comprising a nonvolatile ferroelectric capacitor for storing data;
   a logic processor for performing a logic operation on sensing data outputted from the plurality of cell array blocks, and for outputting input data stored in the plurality of cell array blocks into the plurality of cell array blocks;
   a plurality of input/output port interface units for controlling interface of the sensing data and the input data between the logic processor and the plurality of cell array blocks; and
   a plurality of sense amplifier array units for amplifying the sensing data and outputting the amplified data into the main bitline,
   wherein the plurality of cell array blocks exchange data with the logic processor using a main bitline in the plurality of cell array blocks.

10. The device according to claim 9, wherein at least one of the plurality of cell array blocks is selectively activated.

11. A nonvolatile ferroelectric memory device comprising:
   a cell array block comprising a nonvolatile ferroelectric capacitor for storing data;
   a logic processor for performing a logic operation on sensing data read from the cell array block, and for transmitting input data into the cell array block;
   an input/output port interface unit for controlling interface of the sensing data and the input data between the logic processor and the cell array block; and
   a sense amplifier array unit for amplifying the sensing data and outputting the amplified data into the input/output port interface unit,
   wherein the cell array block exchanges data with the input/output port interface unit and the sense amplifier array unit using a main bitline of the cell array block.

12. The device according to claim 11, further comprising a logic bus for exchanging data between the logic processor and the input/output port interface unit.

13. The device according to claim 11, wherein the sense amplifier array unit comprises a plurality of sense amplifiers connected in parallel sequentially corresponding to a plurality of main bitlines.

14. The device according to claim 13, wherein each of the plurality of sense amplifiers comprises:
   a sensing unit for sensing and amplifying data applied through a main bitline; and a latch unit for storing data applied through the sensing unit and the main bitline.

15. The device according to claim 11, wherein the input/output port interface unit comprises a plurality of interface units connected in parallel sequentially corresponding to a plurality of main bitlines.

16. The device according to claim 15, wherein each of the plurality of interface units comprises:

a write driver, activated in a write mode, for transmitting the input data applied from the logic processor into a main bitline; and a read switch, activated in a read mode, for transmitting the sensing data applied through the main bitline into the logic processor.

17. The device according to claim 11, further comprising:

a wordline driver for driving a corresponding wordline in the cell array block; and a plateline driver for driving a corresponding plateline in the cell array block.

18. The device according to claim 11, wherein the cell array block comprises a plurality of sub cell array blocks.

* * * * *